United States Patent
Fibranz

(10) Patent No.: US 6,363,024 B1
(45) Date of Patent: Mar. 26, 2002

(54) METHOD FOR CARRYING OUT AUTO REFRESH SEQUENCES ON A DRAM

(75) Inventor: Heiko Fibranz, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/716,871

(22) Filed: Nov. 20, 2000

(30) Foreign Application Priority Data

Nov. 18, 1999 (DE) .......................................... 199 55 601

(51) Int. Cl.[7] .................................................. G11C 7/00
(52) U.S. Cl. .................... 365/222; 365/230.03; 365/233
(58) Field of Search ................................ 365/222, 233, 365/230.03, 230.01

(56) References Cited

U.S. PATENT DOCUMENTS

| | | |
|---|---|---|
| 4,932,053 A | 6/1990 | Fruhauf et al. |
| 5,404,402 A | 4/1995 | Sprunk |
| 5,533,123 A | 7/1996 | Force et al. |
| 5,796,669 A | 8/1998 | Araki et al. |
| 5,901,101 A * | 5/1999 | Suzuki et al. ................ 365/222 |
| 6,134,168 A * | 10/2000 | Harrington et al. ......... 365/222 |
| 6,175,531 B1 * | 1/2001 | Buck et al. .................. 365/226 |
| 6,208,577 B1 * | 3/2001 | Mullarky .................... 365/222 |
| 6,252,816 B1 * | 6/2001 | Mullarkey ................... 365/222 |

FOREIGN PATENT DOCUMENTS

| | | |
|---|---|---|
| DE | 195 23 466 C1 | 4/1997 |
| EP | 0 790 547 A1 | 8/1997 |

* cited by examiner

*Primary Examiner*—Viet Q. Nguyen
(74) *Attorney, Agent, or Firm*—Herbert L. Lerner; Laurence A. Greenberg; Werner H. Stemer

(57) ABSTRACT

The auto refresh sequence on a DRAM that is divided into memory banks is synchronized with the clock signal acting on the DRAM. A precharge pulse is transmitted during an NOP intermission or is derived from a precharge pulse of another memory bank.

6 Claims, 2 Drawing Sheets

METHOD FOR CARRYING OUT AUTO REFRESH SEQUENCES ON A DRAM

BACKGROUND OF THE INVENTION

FIELD OF THE INVENTION

The present invention relates to a method for carrying out auto refresh sequences on a DRAM that is divided into memory banks. An activation pulse for reading and rewriting and a precharge pulse indicating the original state are supplied from a command decoder during an auto refresh sequence acting on a memory address, and a clock signal is applied to the DRAM.

In order to avoid a loss of data, it is known that the memory cells of DRAMs (dynamic random access memories) have to be regularly read and then have their contents rewritten, which is referred to as a "refresh" of the memory cells. In order to facilitate the use of DRAMs in practice, they have, therefore, a logic configuration for an auto refresh command: the latter initiates an operation in which a memory address is independently sought in the DRAM and the memory content of the memory cell associated with the memory address is read out; during this operation, the memory content is then written back to the memory cell and the memory cell is returned to its state prior to the auto refresh command. That state is referred to as the so-called "precharge state" or original state.

In order to process the above operation, in an auto refresh sequence after an auto refresh command, first of all an activation pulse is generated, in the case of which the memory cell assigned to the memory address sought is read and rewritten. After a period of time, the activation pulse is followed by a precharge pulse indicating the re-establishment of the original state of the memory cell.

Memory addresses which have been acted on by such an auto refresh sequence are generated in a counter. The counter is incremented by one at the end of each auto refresh sequence, so that all the memory cells of the memory are successively subjected to a refresh.

In the more recent synchronous DRAMs (SDRAMs), the individual commands are transmitted synchronously with a clock signal, although the auto refresh command proceeds without reference to the clock signal and it is based only on internal time delays.

FIG. 3 is a schematic illustration of the signal profile during such an auto refresh sequence ARS. The signals include a clock signal (CLK) a, an auto refresh command b, an activation pulse c, a precharge pulse d, and a counter reading e with values N and N+1 of an auto refresh counter.

As can be seen from FIG. 3, the auto refresh command b is followed by an activation pulse c, which causes the memory content of a memory cell to be read out and rewritten. The precharge pulse d finally re-establishes the original state of the memory cell. After this auto refresh sequence ARS has proceeded, the content e of the auto refresh counter is incremented from N to N+1.

In order to achieve faster memory access and thus optimization, DRAMs can be constructed from a plurality of memory banks A, B, C as is illustrated in FIG. 4. If this is the case, then, in addition to the commands that are otherwise customary in a DRAM, bank select signals bank sel.A, bank sel.B and bank sel.C are also transmitted, which select the respectively addressed memory banks A, B and C. All the memory banks A, B and C receive the same command signals from a command decoder 1, which is driven by an external command "command", so that one command can in each case act on a plurality of memory banks A, B and/or C.

If an auto refresh command is transmitted in a DRAM, then no further command is allowed to be input owing to the ensuing complicated progression of the subsequent commands, such as activation pulse and precharge pulse. At an operating frequency of 200 MHz, these 40 ns correspond to about 8 clock cycles (CLK), which means at most 8 commands. The DRAM cannot be accessed during these 8 clock cycles. This also means, however, that even those memory banks which are not actually addressed by the auto refresh command cannot be accessed.

SUMMARY OF THE INVENTION

The object of the invention is to provide a method of carrying out auto refresh cycles in a DRAM which overcomes the above-noted deficiencies and disadvantages of the prior art devices and methods of this kind, and which allows carrying out auto refresh sequences in which those memory banks which are currently not being subjected to an auto refresh sequence can be accessed by means of commands.

With the above and other objects in view there is provided, in accordance with the invention, a method for carrying out auto refresh sequences on a DRAM having a plurality of memory banks. The method comprises the following steps:

applying a clock signal to a DRAM divided into memory banks;

during an auto refresh sequence acting on a memory address, supplying an activation pulse for reading and rewriting and a precharge pulse indicating an original state from a command decoder;

synchronizing the auto refresh sequence with the clock signal, selecting at least one memory bank with a select signal, and feeding the activation pulse and the precharge pulse to the at least one memory bank selected by the select signal; and forbidding further commands only for the at least one memory bank selected by the auto refresh sequence, and transmitting the precharge pulse during an operating intermission or deriving the precharge pulse from a precharge pulse of another memory bank.

In other words, the auto refresh sequence is synchronized with the clock signal, the activation pulse and the precharge pulse are fed to at least one memory bank selected by the select signal, and further commands are forbidden only for the at least one memory bank selected by the auto refresh sequence, and the precharge pulse is transmitted during an operating intermission or is derived from a precharge pulse of another memory bank.

In the case of the method according to the invention, therefore, during an auto refresh sequence, further commands which differ from the auto refresh command and the activation pulse are forbidden only for those memory banks which are currently selected by the auto refresh command.

If an auto refresh command is transmitted for a selected memory bank, then this auto refresh command is followed by an activation pulse for that memory bank with a corresponding refresh address supplied by the counter. In the example of FIG. 3, the memory address for the counter reading N+1 follows the memory address for the counter reading of N. An auto refresh logic configuration contained in the command decoder 1 or connected thereto registers the selected memory banks. In a following clock cycle CLK, it is already possible to process other memory banks with other commands. After 30 ns or 6 clock cycles, for example, the memory bank has experienced a refresh. Instead of 6 clock cycles, it is also possible to choose a number of clock cycles, for example 20 clock cycles. A precharge pulse must then also be transmitted to the memory bank. However, since there are only one command decoder 1 and also only one precharge line, said precharge pulse cannot be output immediately after the 30 ns or 6 clock cycles have elapsed. The system waits, therefore, until a user no longer outputs a command: the intermission occurring as a result of this is utilized internally in the DRAM to select the memory bank that is currently being subjected to the auto refresh and to supply a precharge pulse to said memory bank.

As an alternative, it is also possible to utilize the precharge pulse which, after an auto refresh sequence on one memory bank has ended, is subsequently fed to another memory bank. In other words, in this exemplary embodiment, both memory banks are supplied with the same precharge pulse.

The method according to the invention affords the advantage that the DRAM is only blocked for the one clock cycle in which the auto refresh pulse is present. During the following clock cycles, the DRAM can be fully utilized for other commands even though the auto refresh sequence is currently proceeding in the selected memory bank.

If a DRAM comprises two banks, for example, and if the latter are processed alternately with the synchronous auto refresh command, then, in the case of such a structure, only the even addresses would experience a refresh in one memory bank and only the odd addresses would experience a refresh in the other memory bank, since the auto refresh address counter is incremented upon each command. Therefore, it is expedient to implement two auto refresh commands from the command decoder 1, the counter being incremented in the case of one auto refresh command and not being incremented in the case of the other auto refresh command.

Other features which are considered as characteristic for the invention are set forth in the appended claims.

Although the invention is illustrated and described herein as embodied in a method for carrying out auto refresh sequences on a DRAM, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 3 and 4 are explained in the introductory text above. In FIGS. 1 and 2, the same reference symbols as in FIGS. 3 and 4 are used for mutually corresponding components.

DESCRIPTION OF THE PREFERRED EMBODIMENTS

Figure 1:
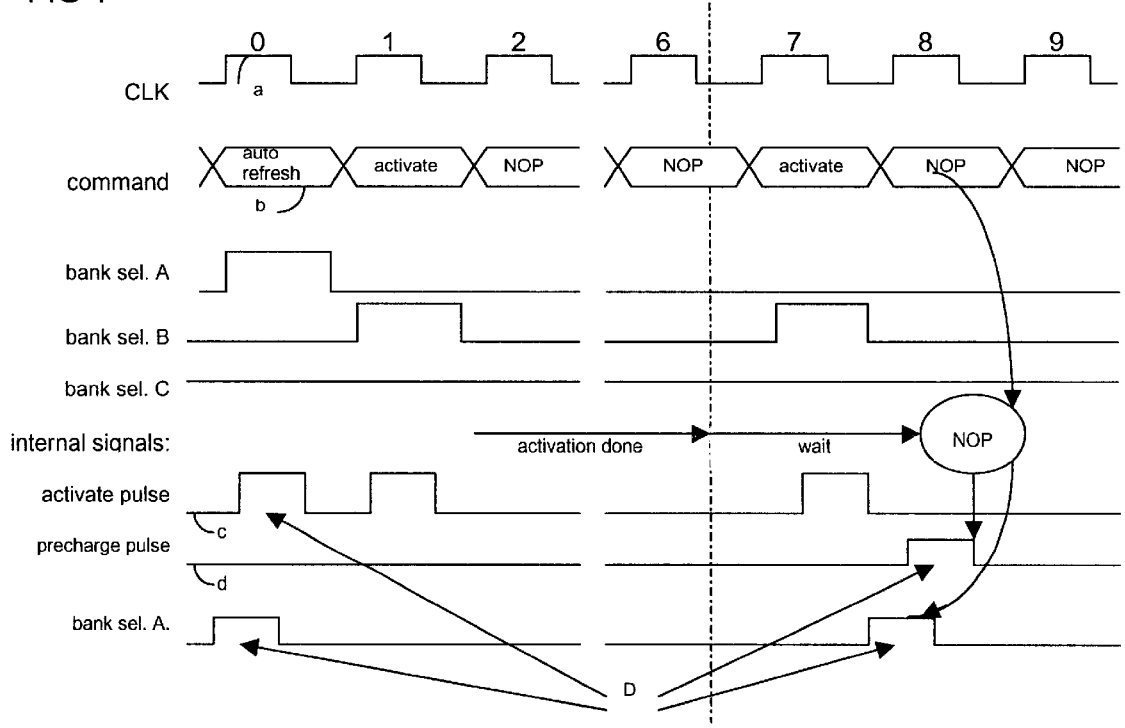
FIG. 1 is a timing diagram with a temporal sequence of commands in a first exemplary embodiment of the invention.

Referring now to the figures of the drawing illustrating the invention in detail and first, particularly, to FIG. 1 thereof, the commands "command", namely auto-refresh, activate and NOP (no operation), are synchronized with the clock signal (CLK) a.

Figure 4:
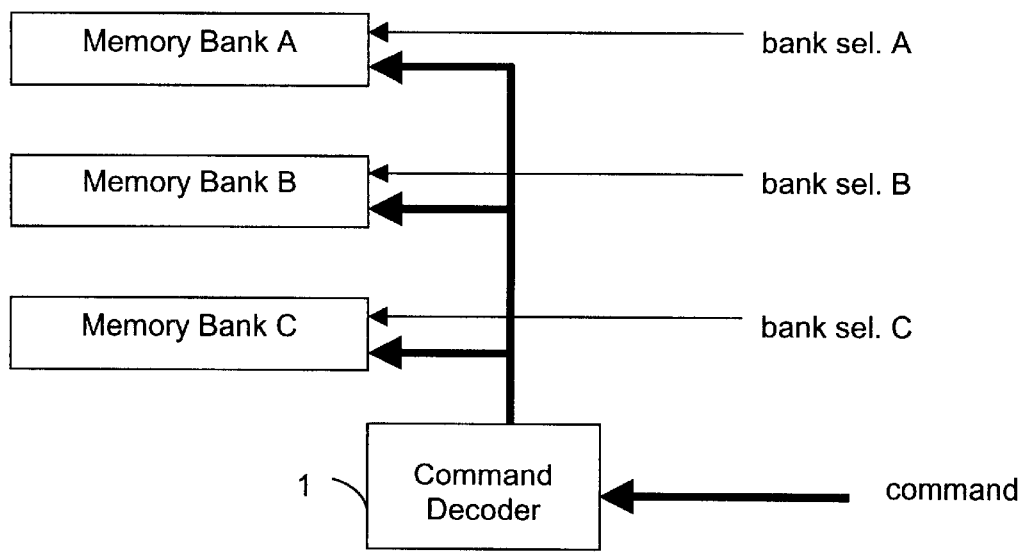
FIG. 4 is a simplified block diagram of a DRAM.

In the example of FIG. 1, during a memory bank select signal bank sel.A for selecting the memory bank A (see FIG. 4), an activation pulse c is output in the auto refresh sequence. An auto refresh is thereby initiated for the memory bank A. During the auto refresh pulse, that is to say during the clock cycle "0", the memory banks cannot be accessed by further commands. However, after the clock cycle "0" has elapsed, that is to say upon the next clock cycle "1", it is already possible to process other memory banks in addition to the memory bank A with further commands.

After 30 ns or 6 clock cycles, the memory bank A has experienced a refresh, so that this activation is concluded or effected. A precharge pulse must then also be transmitted to the memory bank A. For this purpose, the system waits until a user does not transmit a command ("NOP"). The resultant intermission is utilized internally to select the memory bank A that is being subjected to the auto refresh sequence and to supply a precharge pulse d.

In FIG. 1, the pulses identified by arrows D are generated by the auto refresh sequence and are terminated by the NOP intermission occurring after activation has been effected.

Figure 2:
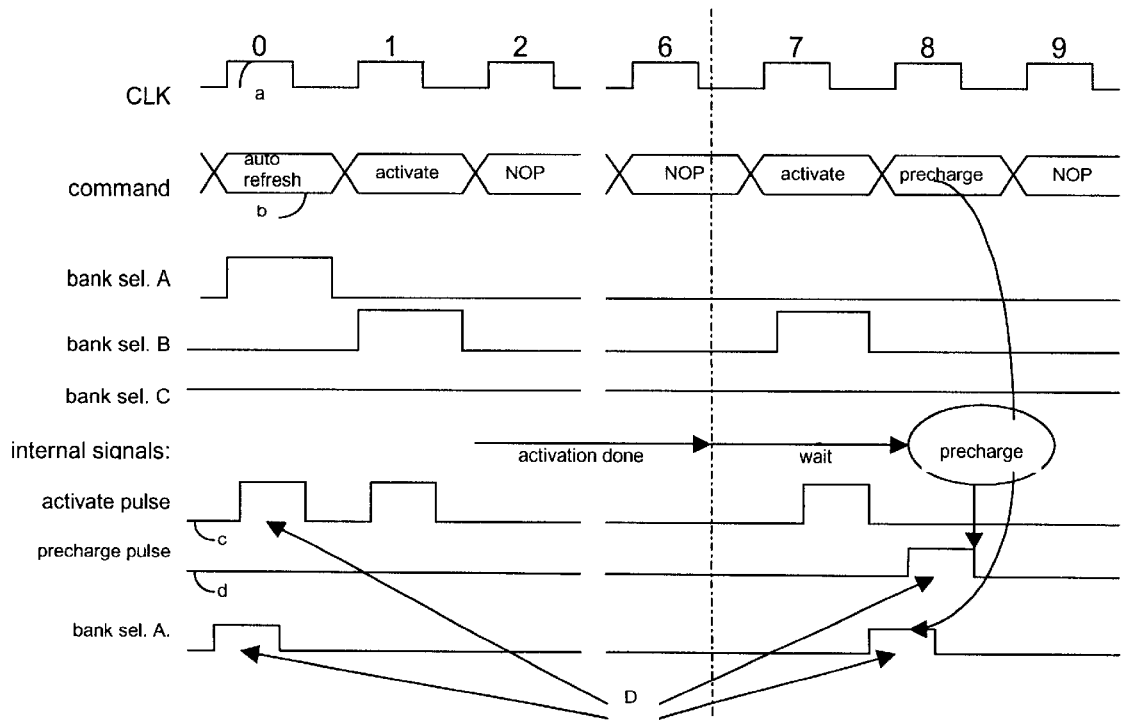
FIG. 2 is a timing diagram with a temporal sequence of commands in a second exemplary embodiment of the invention.
Figure 3:
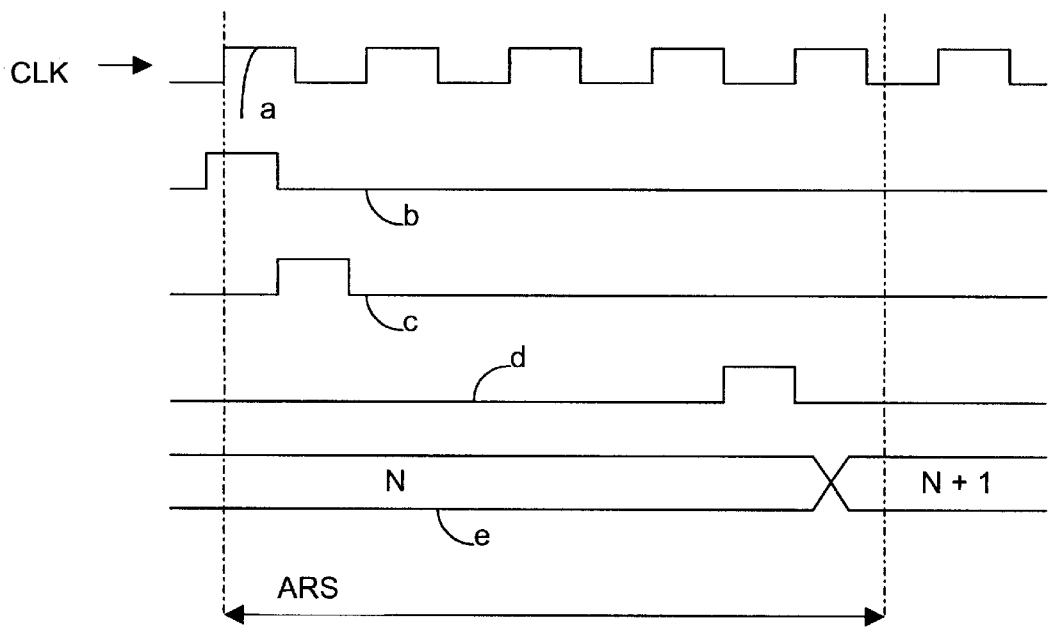
FIG. 3 is a similar timing diagram of a temporal sequence of commands in a prior art system.

With reference to FIG. 2, there is illustrated a further exemplary embodiment of the present invention. Here, once the memory bank A has been activated, the precharge command for the memory bank C is also concomitantly used for the memory bank A in order thus to end the auto refresh sequence for the memory bank A.

I claim:

1. A method for carrying out auto refresh sequences on a DRAM having a plurality of memory banks, which comprises:

applying a clock signal to a DRAM divided into memory banks;

during an auto refresh sequence acting on a memory address, supplying an activation pulse for reading and rewriting and a precharge pulse indicating an original state from a command decoder;

synchronizing the auto refresh sequence with the clock signal, selecting at least one memory bank with a select signal, and feeding the activation pulse and the precharge pulse to the at least one memory bank selected by the select signal; and forbidding further commands only for the at least one memory bank selected by the auto refresh sequence, and transmitting the precharge pulse during an operating intermission or deriving the precharge pulse from a precharge pulse of another memory bank.

2. The method according to claim 1, which comprises, in case of two memory banks, providing two auto refresh commands and respectively increasing a counter reading and leaving the counter reading unchanged with the two refresh commands.

3. The method according to claim 1, which comprises blocking the memory banks only during a clock cycle assigned to an auto refresh command for initiation of an auto refresh sequence.

4. The method according to claim 1, which comprises defining a given number of clock cycles for an auto refresh sequence.

5. The method according to claim 4, wherein the given number of clock cycles is six clock cycles.

6. An auto refresh method for a DRAM having a plurality of memory banks, which comprises:

applying a clock signal to a DRAM divided into memory banks;

synchronizing an auto refresh sequence with the clock signal;

selecting at least one of the memory banks with a select signal, and feeding, from a command decoder, an activation pulse for reading and rewriting and a precharge pulse indicating an original state to the at least one memory bank selected by the select signal; and forbidding further commands only for the at least one memory bank selected by the select signal, and transmitting the precharge pulse during an operating intermission or deriving the precharge pulse from a precharge pulse of another memory bank.

\* \* \* \* \*